US008510625B1

(12) United States Patent
Back et al.

(10) Patent No.: US 8,510,625 B1
(45) Date of Patent: Aug. 13, 2013

(54) MULTI-SITE DATA REDUNDANCY

(75) Inventors: Adam Back, Sliema (MT); Patrick E. Bozeman, Salt Lake City, UT (US); Zachary Wily, Lehi, UT (US)

(73) Assignee: Decho Corporation, Pleasant Grove, UT (US)

( * ) Notice: Subject to any disclaimer, the term of this patent is extended or adjusted under 35 U.S.C. 154(b) by 361 days.

(21) Appl. No.: 12/798,233

(22) Filed: Mar. 31, 2010

(51) Int. Cl.
*H03M 13/00* (2006.01)
*G06F 11/00* (2006.01)

(52) U.S. Cl.
USPC .............................. 714/758; 714/784; 714/20

(58) Field of Classification Search
USPC ................................. 714/784, 20, 758, 766
See application file for complete search history.

(56) References Cited

U.S. PATENT DOCUMENTS

| | | | |
|---|---|---|---|
| 5,265,104 A * | 11/1993 | Weng ............................. | 714/766 |
| 6,826,711 B2 | 11/2004 | Moulton et al. | |
| 7,065,619 B1 | 6/2006 | Zhu et al. | |
| 7,590,747 B2 | 9/2009 | Coates et al. | |
| 7,681,104 B1 * | 3/2010 | Sim-Tang et al. ............. | 714/763 |
| 7,907,773 B2 * | 3/2011 | Bates et al. .................... | 382/154 |
| 2009/0044075 A1 * | 2/2009 | Read .............................. | 714/764 |
| 2009/0319869 A1 * | 12/2009 | Read .............................. | 714/763 |
| 2010/0005364 A1 * | 1/2010 | Higurashi et al. ............. | 714/755 |
| 2010/0094965 A1 * | 4/2010 | Zuckerman et al. .......... | 709/219 |
| 2010/0218037 A1 * | 8/2010 | Swartz et al. ..................... | 714/6 |
| 2011/0055420 A1 * | 3/2011 | Zuckerman et al. .......... | 709/231 |
| 2011/0122523 A1 * | 5/2011 | Gladwin et al. ................. | 360/49 |
| 2011/0289358 A1 * | 11/2011 | Grube et al. .................... | 714/42 |

OTHER PUBLICATIONS

John Kubiatowicz, David Bindel, Yan Chen, Steven Czerwinski, Patrick Eaton, Dennis Geels, Ramakrishan Gummadi, Sean Rhea, Hakim Weatherspoon, Westley Weimer, Chris Wells, and Ben Zhao. 2000. OceanStore: an architecture for global-scale persistent storage. SIGPLAN Not. 35, 11 (Nov. 2000), 190-201.*
Cong Wang; Qian Wang; Kui Ren; Wenjing Lou;, "Ensuring data storage security in Cloud Computing," Quality of Service, 2009. IWQoS. 17th International Workshop on, vol., no., pp. 1-9, Jul. 13-15, 2009.*
Harihara, S.G.; Janakiram, B.; Chandra, M.G.; Aravind, K.G.; Kadhe, S.; Balamuralidhar, P.; Adiga, B.S.;, "SpreadStore: A LDPC Erasure Code Scheme for Distributed Storage System," Data Storage and Data Engineering (DSDE), 2010 International Conference on, vol., no., pp. 154-158, Feb. 9-10, 2010.*
Cooley, J.A.; Mineweaser, J.L.; Servi, L.D.; Tsung, E.T.;, "Software-based erasure codes for scalable distributed storage," Mass Storage Systems and Technologies, 2003. (MSST 2003). Proceedings. 20th IEEE/11th NASA Goddard Conference on, vol., no., pp. 157-164, Apr. 7-10, 2003.*

(Continued)

*Primary Examiner* — Cynthia Britt
(74) *Attorney, Agent, or Firm* — Muirhead and Saturnelli, LLC (57) ABSTRACT

Storing data includes encoding the data using an erasure encoding to provide encoded data, separating the encoded data into a number of components, and providing each of the components to separate data sites. The data may be encoded using a Reed/Solomon encoding. The data may be encoded using a 3-1 Reed/Solomon encoding and the encoded data may be separated into four components that are provided to four separate sites. The data may be encoded by a site that receives the data prior to encoding. The data may be encoded by a client that provides the data to a plurality of sites coupled thereto. Storing data may also include each of the separate data sites providing an additional encoding for the components. The data and the components may be encoded using a Reed/Solomon encoding.

21 Claims, 7 Drawing Sheets

(56) References Cited

OTHER PUBLICATIONS

Hiroyuki Ohde; Haruhiko Kaneko; Eiji Fujiwara;, "Low-Density Triple-Erasure Correcting Codes for Dependable Distributed Storage Systems," Defect and Fault Tolerance in VLSI Systems, 2006. DFT '06. 21st IEEE International Symposium on, vol., no., pp. 175-183, Oct. 2006.*

Kameyama, H.; Sato, Y.;, "Erasure Codes with Small Overhead Factor and Their Distributed Storage Applications," Information Sciences and Systems, 2007. CISS '07. 41st Annual Conference on, vol., no., pp. 80-85, Mar. 14-16, 2007.*

Jun Li; Shuang Yang; Xin Wang; Xiangyang Xue; Baochun Li, "Tree-structured data regeneration with network coding in distributed storage systems," Quality of Service, 2009. IWQoS. 17th International Workshop on, vol., no., pp. 1,9, Jul. 13-15, 2009.*

"Optimized Backup and Recovery for VMware Infrastructure with EMC Avamar," VMware, White Paper, 2007, 11 pp.

* cited by examiner

MULTI-SITE DATA REDUNDANCY

BACKGROUND OF THE INVENTION

1. Technical Field

This application relates to the field of computer data storage, and more particularly to the field of facilitating data storage and data redundancy over a network.

2. Description of Related Art

Backup systems exist in which data is backed up from one or more clients to a centralized backup site using the Internet or another suitable network. These systems have the advantage of not requiring an administrator to manipulate tapes, disks, or other backup media and also eliminating the need for specialized media I/O devices (e.g., a tape device). One drawback to providing backup over a network is that the backup site itself needs to be exceptionally reliable since it holds backup data for a number of clients.

This may be addressed by creating a backup of the centralized backup site. However, doing this effectively doubles the amount of storage space need, which is inefficient in some cases. Accordingly, it is desirable to provide a system that allows for backup of a storage site without doubling the amount of storage space that is needed.

SUMMARY OF THE INVENTION

According to the system described herein, storing data includes encoding the data using an erasure encoding to provide encoded data, separating the encoded data into a number of components, and providing each of the components to separate data sites. The data may be encoded using a Reed/Solomon encoding. The data may be encoded using a 3-1 Reed/Solomon encoding and the encoded data may be separated into four components that are provided to four separate sites. The data may be encoded by a site that receives the data prior to encoding. The data may be encoded by a client that provides the data to a plurality of sites coupled thereto. Storing data may also include each of the separate data sites providing an additional encoding for the components. The data and the components may be encoded using a Reed/Solomon encoding.

According further to the system described herein, computer software is provided in a computer-readable storage medium. The software includes executable code that encodes data using an erasure encoding to provide encoded data, executable code that separates the encoded data into a number of components, and executable code that provides each of the components to separate data sites. The data may be encoded using a Reed/Solomon encoding. The data may be encoded using a 3-1 Reed/Solomon encoding and the encoded data may be separated into four components that are provided to four separate sites. The data may be encoded by a site that receives the data prior to encoding. The data may be encoded by a client that provides the data to a plurality of sites coupled thereto. The data and the components may be encoded using a Reed/Solomon encoding.

According further to the system described herein, recovering encoded data includes obtaining encoded data from at least one separate data site and performing data recovery using the encoded data. The data may be encoded using a Reed/Solomon encoding. At least some of the data may be encoded using a 3-1 Reed/Solomon encoding and the encoded data may be provided in four components that are provided to four separate sites.

BRIEF DESCRIPTION OF DRAWINGS

Embodiments of the system are described with reference to the several figures of the drawings, noted as follows.

DETAILED DESCRIPTION OF VARIOUS EMBODIMENTS

Referring now to the figures of the drawing, the figures comprise a part of this specification and illustrate exemplary embodiments of the described system. It is to be understood that in some instances various aspects of the system may be shown schematically or may be exaggerated or altered to facilitate an understanding of the system.

Figure 1:
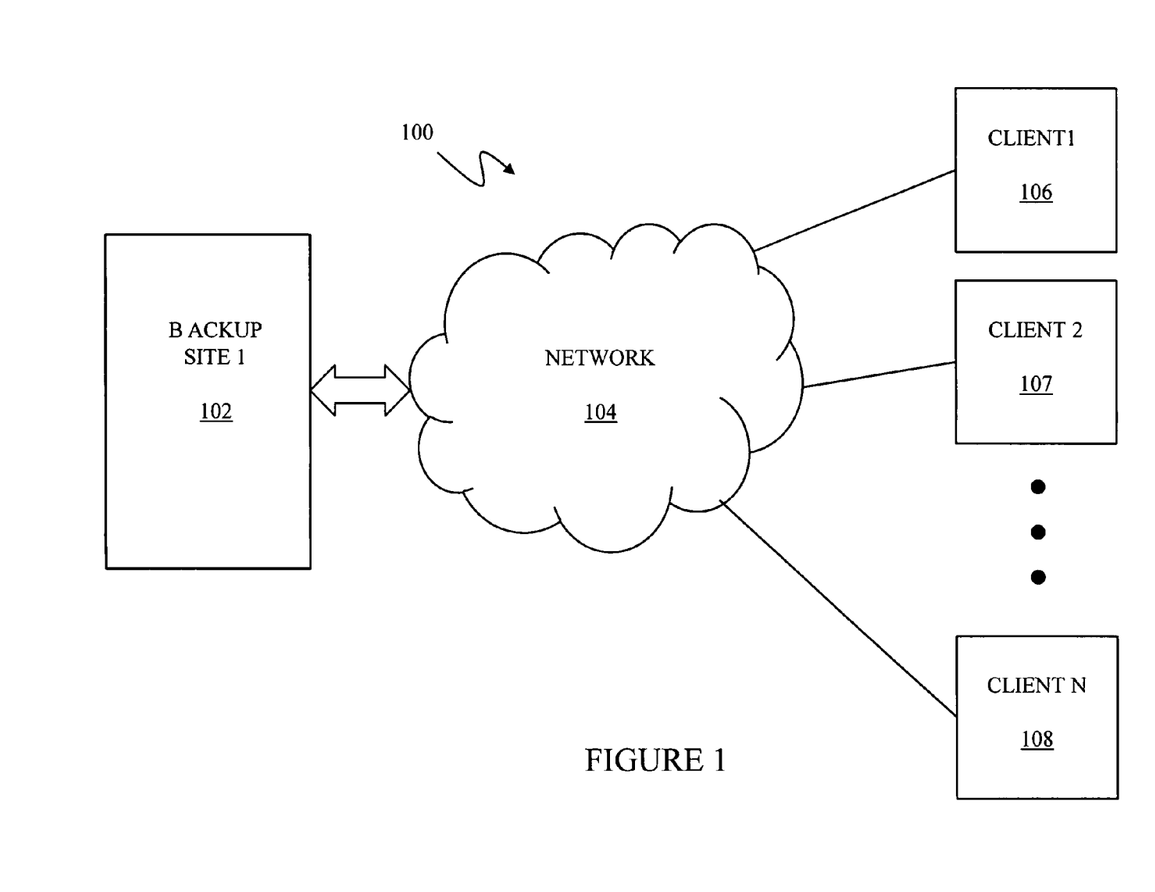
FIG. 1 is a schematic diagram illustrating a system that includes a backup site, a network, and a plurality of clients according to an embodiment of the system described herein.

Referring to FIG. 1, a system 100 includes a backup site 102, a network 104, and a plurality of clients 106-108. The backup site 102 and the clients 106-108 are all coupled to the network 104, which may be any type of network, such as the Internet, for interconnecting computer data devices. Each of the clients 106-108 uses the network 104 to provide backup data to the backup site 102. Note that, although only three clients are shown in FIG. 1, the system 100 may accommodate any number of clients for which the backup site 102 can provide the functionality described herein. Each of the clients may be geographically separated from the backup site.

Initially, each of the clients 106-108 may provide a full backup to the backup site 102 followed by providing incremental backups. Incremental backups represent changes in the data since the last backup so that, in effect, the incremental backup is based on the full backup and the data may be recreated using the full backup and the incremental backup(s). Full backups and incremental backups are known. For the system described herein, any appropriate full/incremental backup technique may be used. Note that it is possible to backup all of the data of one of the clients 106-108 or a subset thereof.

Figure 2:
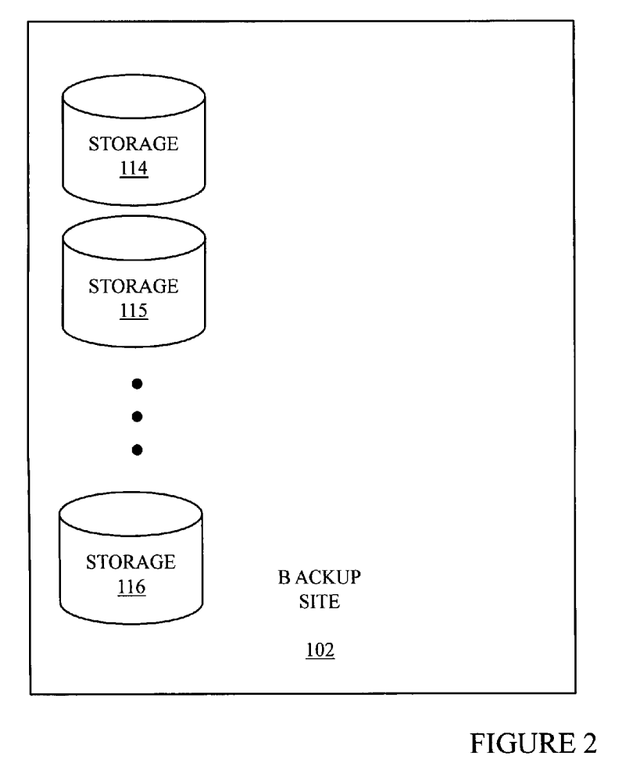
FIG. 2 is a schematic diagram illustrating a backup site in more detail according to an embodiment of the system described herein.

Referring to FIG. 2, the backup site 102 is shown in more detail as including a plurality of separate storage devices 114-116. Although only three storage devices are shown in FIG. 2, the storage devices 114-116 represent any number of storage devices. In an embodiment herein, the storage devices 114-116 may be stand-alone independent storage devices where local failure of one of the storage devices 114-116 does not necessarily cause failure of another one of the storage devices 114-116. As described in more detail elsewhere herein, data may be distributed among the storage devices 114-116 to provide for error detection/correction in the case of loss of some of the data.

Figure 3:
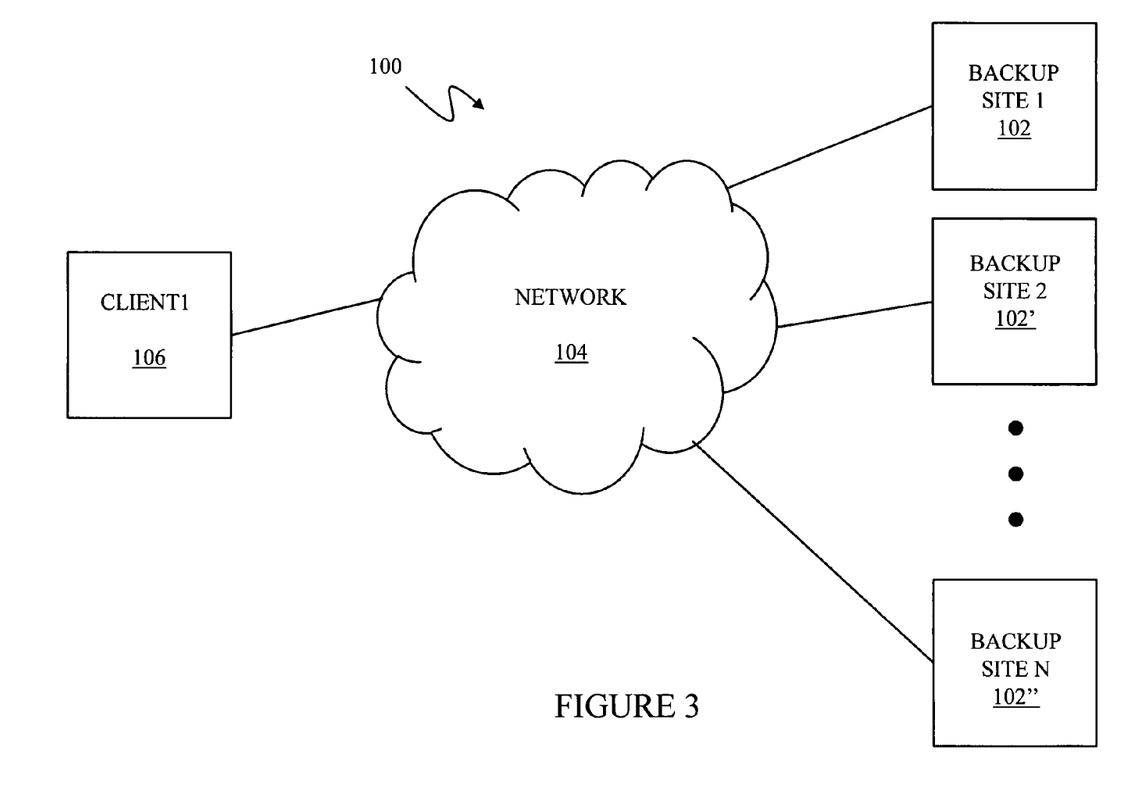
FIG. 3 is a schematic diagram illustrating a client and a plurality of backup sites according to an embodiment of the system described herein.

Referring to FIG. 3, the system 100 is shown as including the backup site 102 as well as additional backup sites 102', 102" interconnected through the network 104 to the client 106. Although only three backup sites are shown in FIG. 3, the backup sites 102, 102', 102" represent any number of backup sites. Similarly, although the backup sites 102, 102', 102" and the client 106 are shown as being interconnected through the network 104, the backup sites 102, 102', 102" and the client 106 may be interconnected by any appropriate mechanism and different mechanisms may be used to interconnect different ones of the backup sites 102, 102', 102" and the client 106.

In an embodiment herein, the backup sites 102, 102', 102" may be stand-alone independent sites where the local failure of one of the backup sites 102, 102', 102" does not necessarily cause failure of another one of the backup sites 102, 102', 102". As described in more detail elsewhere herein, data may be distributed among the backup sites 102, 102', 102" to provide for error detection/correction in the case of loss of some of the data.

Figure 4:
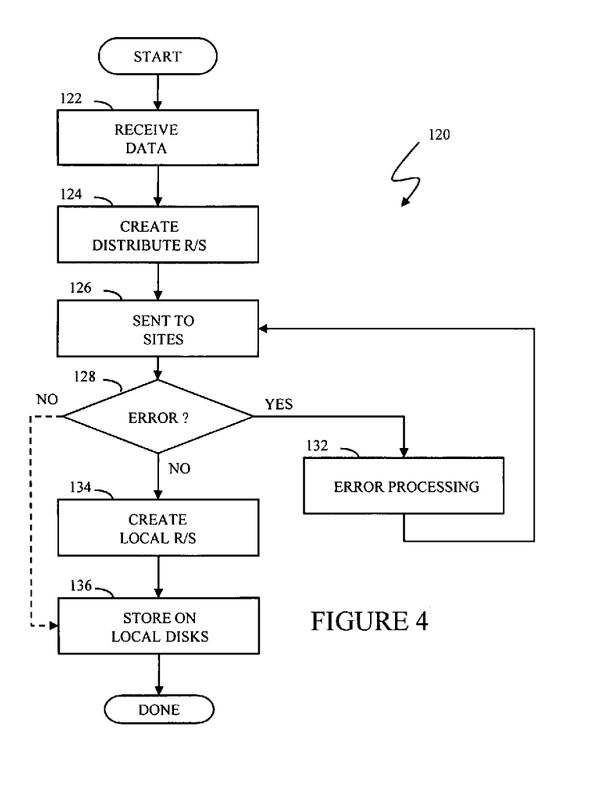
FIG. 4 is a flow chart illustrating processing performed in connection with distributing data according to an embodiment of the system described herein.

Referring to FIG. 4, a flow chart 120 illustrates processing performed by a backup site (e.g., the backup site 102) in connection with distributing data according to the system described herein. The processing illustrated by the flow chart 120 is for an embodiment in which a client (e.g., the client 106) sends unencoded data to the site. Other embodiments are described elsewhere herein.

Processing begins at a first step 122 where the site receives the data from the client (or possibly other source). Following the step 122 is a step 124 where the site creates a distributed Reed/Solomon encoding for the data. In an embodiment herein, a 3-1 Reed/Solomon encoding is used. Note also that the increments to which the encoding is applied may be adjusted. In an embodiment herein, the encoding may be applied to a chunk of data at a time so that, for example, three chunks of data and one chunk of parity/correction information are provided for every three chunks of data. The data is stored on four separate sites. The chunks can be any size and may depending on the particular encoding used and/or may be a design choice. In addition, the encoding may be provided in different increments, such as at the byte level, the file level, etc. and may use a different number of sites.

Following the step 124 is a step 126 where the data is distributed to other sites. The distribution at the step 126 may be provided using any appropriate mechanism, including through the network 104, by direct connection, using a storage medium (e.g., portable hard drive), etc. Following the step 126 is a test step 128 where it is determined if there are any errors associated with any of the distributions. For example, an error may occur if one of sites is not connected to the network 104 and/or is otherwise non-operational. If it is determined at the step 128 that an error has occurred, then control passes from the test step 128 to a step 132 where error processing is performed. The error processing at the step 132 may be any appropriate error processing, and may include reporting the error to an administrator, selecting one or more new sites, waiting a predetermined amount of time, etc. Following the step 132, control transfers back to the step 126, discussed above, to attempt to distribute the data to other sites again. Of course, it is possible to include additional processing (not shown) to prevent the step 126, 128, 132 from becoming an infinite loop.

If it is determined at the test step 128 that no error has occurred, then control transfers from the test step 128 to a step 134 where the site creates the local Reed/Solomon encoding. In an embodiment herein, a 9-3 Reed/Solomon encoding is used at the step 134. Note that the increments to which the encoding is applied may be adjusted. In an embodiment herein, the encoding may be applied to a chunk's worth of data at a time so that, for example, to provide the 9-3 encoding, nine chunks of data and three chunks of parity/correction information are provided for every nine chunks of data. The data is stored on twelve separate devices. The chunks can be any size and may depending on the particular encoding used and/or may be a design choice. In addition, the encoding may be provided in different increments, such as at the byte level, the file level, etc. and may use a different number of sites.

Following the step 134 is a step 136 where the data is stored locally by the site performing the processing. The site may store the data on different ones of the storage devices 114-116 using the encoding provided at the step 134. Following the step 136, processing is complete. In other embodiments, the site (and other sites) would not perform the local encoding for distribution among the storage devices, in which case the step 134 may be skipped. This is illustrated by an alternative path 138 from the test step 128 to the step 136.

Figure 5:
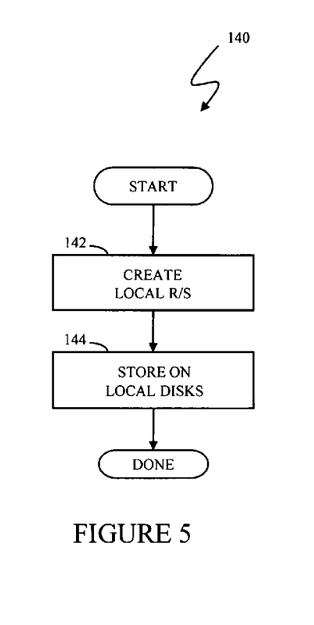
FIG. 5 is a flow chart illustrating processing performed in connection with a site receiving distributed data from another site according to an embodiment of the system described herein.

Referring to FIG. 5, a flow chart 140 illustrates steps performed in connection with a site receiving distributed data from another site (e.g., from the site that distributed data at the step 126, described above). Processing begins at a step 142 where the site creates the local Reed/Solomon encoded data. In an embodiment herein, a 9-3 Reed/Solomon encoding is used at the step 142. However, other erasure encodings may be used and it is possible to use an encoding that is different from that used by any other sites, including the site that distributed the data. As discussed above, the increments to which the encoding is applied may be adjusted. In an embodiment herein, the encoding may be applied to a chunk's worth of data at a time so that, for example, to provide the 9-3 encoding, nine chunks of data and three chunks of parity/correction information are provided for every nine chunks of data. The data is stored on twelve separate storage devices within a site. The chunks can be any size and may depending on the particular encoding used and/or may be a design choice. In addition, the encoding may be provided in different increments, such as at the byte level, the file level, etc. and may use a different number of sites.

Following the step 142 is a step 144 where the data is stored locally at the site. The step 144 is similar to the step 136, discussed above. Following the step 144, processing is complete.

Although it may be efficient for backup sites to perform the processing associated with the local and distributed encodings described herein, it is also possible for the client to do some or all of the processing. This is described in more detail below.

Figure 6:
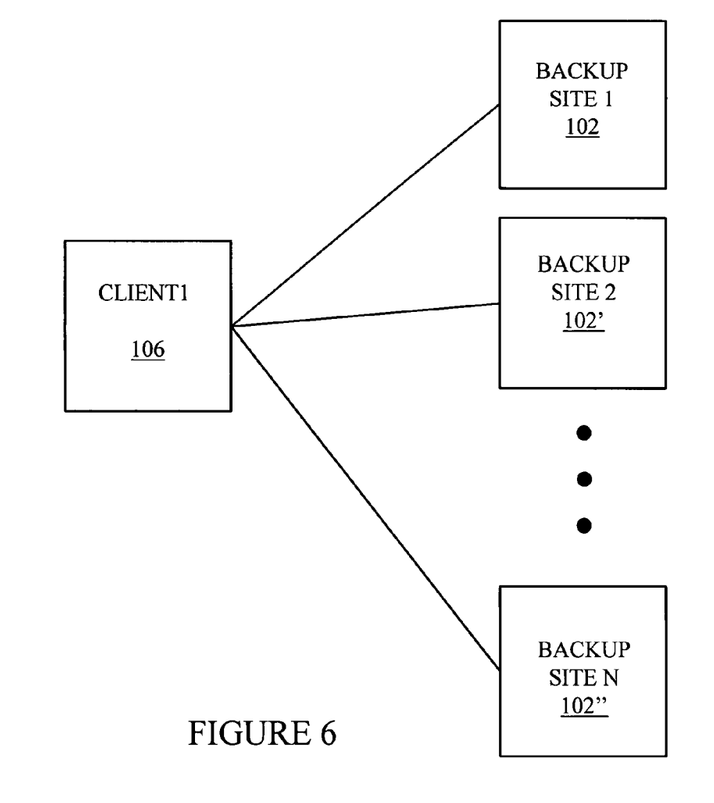
FIG. 6 is a schematic diagram illustrating a client and a plurality of backup sites according to an embodiment of the system described herein.

Referring to FIG. 6, the client 106 is shown as being in communication with the backup sites 102, 102', 102". As discussed elsewhere herein, the communication may be by any appropriate mechanism, including through the network 104 (not shown in FIG. 6). In the embodiment illustrated in FIG. 6, the client 106 performs encoding for the distributed data and/or encoding for the local data. Having the client 106 do some or all of the encoding may increase the processing burden on the client 106 and/or increase the bandwidth that is needed.

Figure 7:
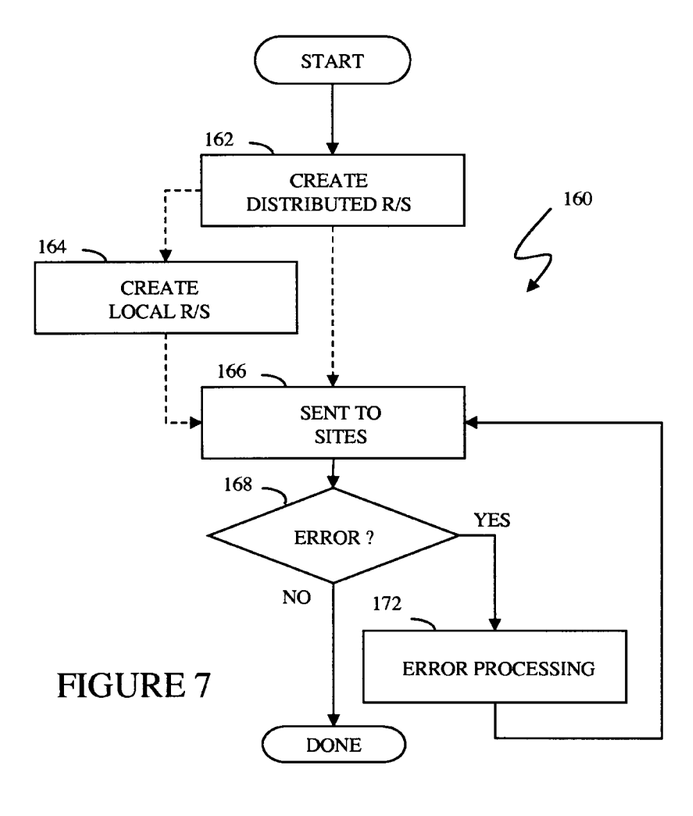
FIG. 7 is a flow chart illustrating processing performed in connection with distributing data according to an embodiment of the system described herein.

Referring to FIG. 7, a flow chart 160 illustrates steps performed by a client in connection with providing encoded distributed data and possibly encoded local data. Processing begins at a first step 162 where the client creates the distributed encoded data. In an embodiment herein, a 3-1 Reed/

Solomon encoding is used. Note that the increments to which the encoding is applied may be adjusted. In an embodiment herein, the encoding may be applied to a chunk's worth of data at a time so that, for example, to provide the 3-1 encoding, three chunks of data and one chunk of parity/correction information are provided for every three chunks of data. The data is stored on four separate sites. The chunks can be any size and may depending on the particular encoding used and/or may be a design choice. In addition, the encoding may be provided in different increments, such as at the byte level, the file level, etc. and may use a different number of sites.

Following the step 162 is a step 164 where the client creates the local encoded data (i.e., to be distributed among a plurality of storage devices at one or more of the sites). In an embodiment herein, a 9-3 Reed/Solomon encoding is used. Note that the increments to which the encoding is applied may be adjusted. In an embodiment herein, the encoding may be applied to a chunk's worth of data at a time so that, for example, to provide the 9-3 encoding, nine chunks of data and three chunks of parity/correction information are provided for every nine chunks of data. The data is stored on four separate sites. The chunks can be any size and may depending on the particular encoding used and/or may be a design choice. In addition, the encoding may be provided in different increments, such as at the byte level, the file level, etc. and may use a different number of sites.

Following the step 164 is a step 166 where the encoded data is sent to the sites for storage. Note that the step 164 is optional so that, in embodiments where the client does not provide the local encoded data, the step 164 is skipped and the step 166 follows directly from the step 162. The distribution at the step 166 may be provided using any appropriate mechanism, including through the network 104, by direct connection, using a storage medium (e.g., portable hard drive), etc.

Following the step 166 is a test step 168 where it is determined if there are any errors associated with any of the distributions. For example, an error may occur if one of sites is not connected to the network 104 and/or otherwise non-operational. If it is determined at the test step 168 that no error has occurred, then processing is complete. Otherwise, control passes from the test step 168 to a step 172 where error processing is performed. The error processing at the step 172 may be any appropriate error processing, and may include reporting the error to an administrator, selecting one or more new sites, waiting a predetermined amount of time, etc. Following the step 172, control transfers back to the step 166, discussed above, to attempt to distribute the data again. Of course, it is possible to include additional processing (not shown) to prevent the step 166, 168, 172 from becoming an infinite loop.

Figure 8:
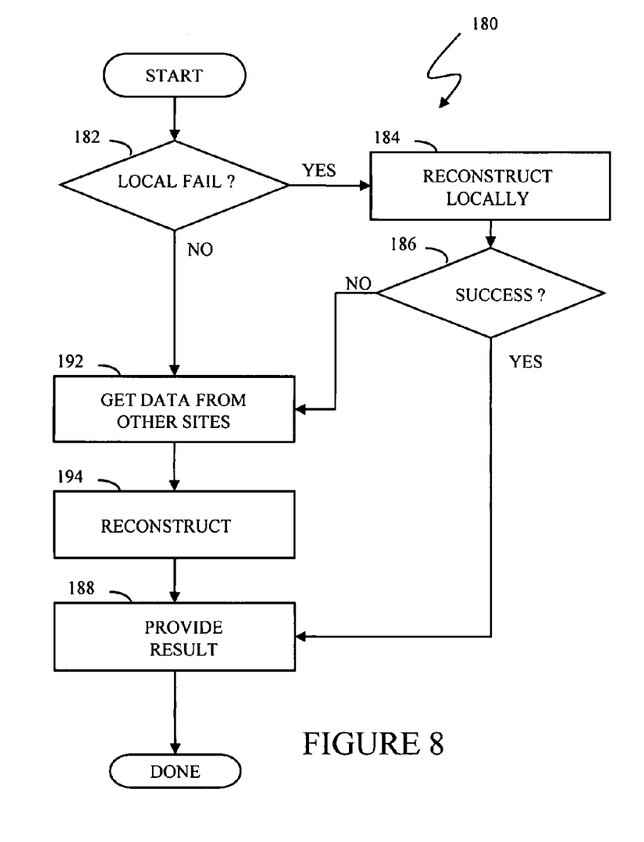
FIG. 8 is a flow chart illustrating recovering data according to an embodiment of the system described herein.

Referring to FIG. 8, a flow chart 180 illustrates steps performed by a site in connection with recovering data. Processing begins at a first test step 182 where it is determined if the failure (loss of data) is local to the site. As discussed elsewhere herein, it is possible for a site to provide an error correction encoding of data stored locally thereon. Thus, if the data that is lost is local to the site, it may be possible to make the correction using only the remaining data at the site.

If it is determined at the test step 182 that the failure is local, then control passes from the test step 182 to a step 184 where the data is reconstructed locally. Reconstructing data that has been encoded using Reed/Solomon encoding, or other types of erasure encoding such as a different BCH encoding, is known in the art. Following the step 184 is a test step 186 where it is determined if the local reconstruction at the step 184 was successful. In some cases the local reconstruction cannot be performed because, for example, not enough local data is available.

If it is determined at the test step 186 that the reconstruction was successful, then control transfers from the test step 186 to a step 188 where the result of the reconstruction is provided. The result may include the reconstructed data as well as an indicator (Boolean variable) that indicates whether the reconstruction was successful. Following the step 188, processing is complete.

If it is determined at the test step 186 that the reconstruction was not successful, then control transfers from the test step 186 to a step 192 where data is obtained from other sites (e.g., by requesting the data over the network 104). Note that the step 192 is also reached directly from the test step 182 if the failure is not local (e.g., involves data from other sites). If the data cannot be reconstructed locally for any reason, then data is obtained from other sites at the step 192. Following the step 192 is a step 194 where the data is reconstructed (or not, as the case may be). Following the step 194 is the step 188, discussed above, where the result of the reconstruction is provided.

The system described herein may be implemented on any appropriate platform, including storage having multiple tiers of physical memory. In addition, any appropriate error detection/correction encoding (erasure encoding) may be used, including other BCH encodings. Furthermore, although the system has been described herein using client backup sites as an example, the system may be implemented/adapted to any type of data storage site.

In some instances, the order of steps in the flowcharts may be modified, where appropriate. The system described herein may be implemented using the hardware described herein, variations thereof, or any other appropriate hardware capable of providing the functionality described herein. Thus, for example, one or more storage devices having components as described herein may, alone or in combination with other devices, provide an appropriate platform that executes any of the steps described herein. The system also includes computer software, in a computer readable medium, that executes any of the steps described herein.

While the invention has been disclosed in connection with various embodiments, modifications thereon will be readily apparent to those skilled in the art. Accordingly, the spirit and scope of the invention is set forth in the following claims.

What is claimed is:

1. A method of storing data, comprising:
receiving or generating first data at a first site of a plurality of data sites, wherein the first site includes a plurality of storage devices;
encoding, at the first site, in a first encoding process, the first data using erasure encoding to provide first encoded data;
separating the first encoded data into a plurality of first components;
distributing, from the first site, the first components among at least two separate data sites of the plurality of data sites, the at least two separate data sites being different from the first site;
encoding, at the first site, in a second encoding process, the first data using erasure encoding to provide second encoded data;
separating the second encoded data into a plurality of second components; and
storing, locally at the first site, the second components of the second encoded data among the plurality of storage devices of the first site, wherein the first encoding process and the plurality of first components depend on a number of available data sites of the plurality of data sites that are available to receive first component transmissions from the first site, and wherein the second encoding process and the plurality of second components depend on a number of available storage devices of the first site that are available to store second components.

2. The method, according to claim 1, wherein the first data is encoded using a Reed/Solomon encoding.

3. The method, according to claim 1, wherein the first data is encoded using a 3-1 Reed/Solomon encoding and wherein the first encoded data is separated into four components that are provided to four separate sites.

4. The method, according to claim 1, wherein the first data is generated at the first site before the first data is encoded by the first site.

5. The method, according to claim 1, wherein the first data is generated by a client site that provides the first data to the first site coupled thereto.

6. The method, according to claim 1, further comprising:
after receiving the distributed first components, each of the separate data sites providing an additional encoding for the first components.

7. The method, according to claim 6, wherein the first components are additionally encoded at the separate data sites using a Reed/Solomon encoding.

8. The method according to claim 1, further comprising:
after distributing the first components of the first encoded data, obtaining, at the first site, at least one of the first components from at least one of the separate data sites; and
performing recovery of the first data using the at least one of the first components obtained from the at least one of the separate data sites.

9. The method according to claim 1, wherein the first encoding process is independent of the second encoding process.

10. The method according to claim 1, further comprising:
receiving, at the first site, at least one other component of encoded data distributed by at least one other site of the plurality of data sites to the first site, the first site thereby acting as a separate data site to receive encoded data component transmissions from the at least one other data site.

11. The method according to claim 1, further comprising:
performing recovery of the first data using at least one of the second components locally stored among the plurality of storage devices at the first site.

12. A non-transitory computer-readable medium having software, the software comprising:
executable code that receives or generates first data at a first site of a plurality of data sites, wherein the first site includes a plurality of storage devices;
executable code that encodes, at the first site, in a first encoding process, the first data using erasure encoding to provide first encoded data;
executable code that separates the first encoded data into a plurality of first components;
executable code that distributes, from the first site, the first components among at least two separate data sites of the plurality of data sites, the at least two separate data sites including a second site and a third site, the second site and the third site being different from the first site;
executable code that encodes, at the first site, in a second encoding process, the first data using erasure encoding to provide second encoded data;
executable code that separates the second encoded data into a plurality of second components; and
executable code that stores, locally at the first site, the second components of the second encoded data among the plurality of storage devices of the first site, wherein the first encoding process and the plurality of first components depend on a number of available data sites of the plurality of data sites that are available to receive first component transmissions from the first site, and wherein the second encoding process and the plurality of second components depend on a number of available storage devices of the first site that are available to store second components.

13. The non-transitory computer readable medium according to claim 12, wherein the first data is encoded using a Reed/Solomon encoding.

14. The non-transitory computer readable medium according to claim 12, wherein the first data is encoded using a 3-1 Reed/Solomon encoding and wherein the first encoded data is separated into four components that are provided to four separate sites.

15. The non-transitory computer readable medium according to claim 12, wherein the data is generated at the first site before the first data is encoded by the first site.

16. The non-transitory computer readable medium according to claim 12, wherein the first data is generated by a client site that provides the first data to the first site coupled thereto.

17. The non-transitory computer readable medium according to claim 12, wherein, after receiving the distributed first components, each of the separate data sites provides an additional encoding for the first components.

18. The non-transitory computer readable medium according to claim 12, wherein the software further comprises:
executable code that, after distributing the first components of the first encoded data, obtains, at the first site, at least one of the first components from at least one of the separate data sites; and
executable code that performs recovery of the first data using the at least one of the first components obtained from the at least one of the separate data sites.

19. The non-transitory computer readable medium according to claim 12, wherein the first encoding process is independent of the second encoding process.

20. The non-transitory computer readable medium according to claim 12, further comprising:
executable code that receives, at the first site, at least one other component of encoded data distributed by at least one other site of the plurality of data sites to the first site, the first site thereby acting as a separate data site to receive encoded data component transmissions from the at least one other data site.

21. The non-transitory computer readable medium according to claim 12, further comprising:
executable code that performs recovery of the first data using at least one of the second components locally stored among the plurality of storage devices at the first site.

* * * * *